(12) United States Patent
Vahedi et al.

(10) Patent No.: US 7,138,067 B2
(45) Date of Patent: Nov. 21, 2006

(54) METHODS AND APPARATUS FOR TUNING A SET OF PLASMA PROCESSING STEPS

(75) Inventors: Vahid Vahedi, Oakland, CA (US); John Daugherty, Fremont, CA (US); Harmeet Singh, Fremont, CA (US); Anthony Chen, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 232 days.

(21) Appl. No.: 10/951,552

(22) Filed: Sep. 27, 2004

(65) Prior Publication Data

US 2006/0065628 A1    Mar. 30, 2006

(51) Int. Cl.
*B44C 1/22* (2006.01)
*H01L 21/00* (2006.01)

(52) U.S. Cl. .............................. 216/67; 216/58; 216/59; 438/706; 438/710; 156/345.23

(58) Field of Classification Search .................. 216/58, 216/59, 67; 438/706, 710; 156/345.23
See application file for complete search history.

(56) References Cited

U.S. PATENT DOCUMENTS 5,740,009 A * 4/1998 Pu et al. ...................... 361/234
5,993,594 A   11/1999 Wicker et al.
5,998,932 A   12/1999 Lenz
6,036,836 A    3/2000 Peeters et al.
6,257,168 B1   7/2001 Ni et al.
6,344,105 B1 * 2/2002 Daugherty et al. .... 156/345.51

* cited by examiner

*Primary Examiner*—Shamim Ahmed
(74) *Attorney, Agent, or Firm*—IP Strategy Group, PC

(57) ABSTRACT

In a plasma processing system, a method of tuning of a set of plasma processing steps is disclosed. The method includes striking a first plasma comprising neutrals and ions in a plasma reactor of the plasma processing system. The method also includes etching in a first etching step a set of layers on a substrate; positioning a movable uniformity ring around the substrate, wherein a bottom surface of the uniformity ring is about the same height as a top surface of the substrate; and striking a second plasma consisting essentially of neutrals in the plasma reactor of the plasma processing system. The method further includes etching in a second etching step the set of layers on the substrate; and wherein the etching in the first step and the etching in the second step are substantially uniform.

9 Claims, 6 Drawing Sheets

METHODS AND APPARATUS FOR TUNING A SET OF PLASMA PROCESSING STEPS

BACKGROUND OF THE INVENTION

The present invention relates in general to substrate manufacturing technologies and in particular to methods and apparatus for tuning a set of plasma processing steps.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited (deposition) in order to form electrical components thereon.

In an exemplary plasma process, a substrate is coated with a thin film of hardened emulsion (i.e., such as a photoresist mask) prior to etching. Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate plasmas are then sequentially struck to in order to etch various exposed layers on the substrate.

Plasma is generally comprised of partially ionized gas. Because the plasma discharge is RF driven and weakly ionized, electrons in the plasma are not in thermal equilibrium with ions. That is, while the heavier ions efficiently exchange energy by collisions with the background gas (e.g., argon, etc.), electrons absorb the thermal energy. Because electrons have substantially less mass than that of ions, electron thermal velocity is much greater than the ion thermal velocity. This tends to cause the faster moving electrons to be lost to surfaces within the plasma processing system, subsequently creating positively charged ion sheath between the plasma and the surface. Ions that enter the sheath are then accelerated into the surface.

Lower RF frequencies tend to cause plasma ions to cross the sheath in less than one RF cycle, creating large variations in ion energy. Likewise, higher RF frequencies tend to cause plasma ions take several RF cycles to cross the sheath, creating a more consistent set of ion energies. Higher frequency tends to result in lower sheath voltages than when excited by a lower frequency signal at a similar power level.

Referring now to FIG. 1, a simplified diagram of plasma processing system components is shown. Generally, an appropriate set of gases is flowed into chamber 102 through an inlet 108 from gas distribution system 122. These plasma processing gases may be subsequently ionized to form a plasma 110, in order to process (e.g., etch or deposition) exposed areas of substrate 114, such as a semiconductor substrate or a glass pane, positioned with edge ring 115 on an electrostatic chuck 116. In addition, liner 117 provides a barrier between the plasma and the plasma processing chamber, as well as helping to optimize plasma 110 on substrate 114.

Gas distribution system 122 is commonly comprised of compressed gas cylinders 124a–f containing plasma processing gases (e.g., $C_4F_8$, $C_4F_6$, $CHF_3$, $CH_2F_3CF_4$, HBr, $CH_3F$, $C_2F_4$, $N_2$, $O_2$, Ar, Xe, He, $H_2$, $NH_3$, $SF_6$, $BCl_3$, $Cl_2$, $WF_6$, etc.). Gas cylinders 124a–f may be further protected by an enclosure 128 that provides local exhaust ventilation. Mass flow controllers 126a–f are commonly a self-contained devices (consisting of a transducer, control valve, and control and signal-processing electronics) commonly used in the semiconductor industry to measure and regulate the mass flow of gas to the plasma processing system. Injector 109 introduces plasma processing gases 124 into chamber 102.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a–b is matching network 132 that may be further coupled to RF generator 138. Matching network 132 attempts to match the impedance of RF generator 138, which typically operates at 13.56 MHz and 50 ohms, to that of the plasma 110.

Generally, some type of cooling system is coupled to the chuck in order to achieve thermal equilibrium once the plasma is ignited. The cooling system itself is usually comprised of a chiller that pumps a coolant through cavities in within the chuck, and helium gas pumped between the chuck and the substrate. In addition to removing the generated heat, the helium gas also allows the cooling system to rapidly control heat dissipation. That is, increasing helium pressure subsequently also increases the heat transfer rate. Most plasma processing systems are also controlled by sophisticated computers comprising operating software programs. In a typical operating environment, manufacturing process parameters (e.g., voltage, gas flow mix, gas flow rate, pressure, etc.) are generally configured for a particular plasma processing system and a specific recipe.

In general, there are three types of etch processes used to etch the various layers on the substrate: pure chemical etch, pure physical etch, and reactive ion etch.

Pure chemical etching generally involves no physical bombardment, but rather a chemical interaction of neutral molecules (neutrals) with materials on the substrate (e.g., Al, etc.). Subsequently, the chemical reaction rate could be very high or very low, depending on the process. For example, fluorine-based molecules tend to chemically interact with dielectric materials on the substrate, wherein oxygen-based molecules tend to chemically interact with organic materials on the substrate, such as photoresist.

Pure ion etching, often called sputtering, is used to dislodge material from the substrate (e.g., oxide, etc.). Commonly an inert gas, such as Argon, is ionized in a plasma and subsequently accelerate toward a negatively charged substrate. Pure ion etching is both anisotropic (i.e., principally in one direction) and non-selective. That is, selectivity to a particular material tends to be very poor, since sputtering rate of most materials are similar. In addition, the etch rate of the pure ion etching is commonly low, depending generally on the flux and energy of the ion bombardment.

Reactive ion etch (RIE), also called ion-enhanced etching, combines both chemical and ion processes in order to remove material from the substrate (e.g., photoresist, BARC, TiN, Oxide, etc.). Generally ions in the plasma enhance a chemical process by striking the surface of the substrate, and subsequently breaking the chemical bonds of the atoms on the surface in order to make them more susceptible to reacting with the molecules of the chemical process. Since ion etching is mainly perpendicular, while the chemical etching is both perpendicular and vertical, the perpendicular etch rate tends to be much faster than in then horizontal direction. In addition, RIE tends to have an anisotropic profile.

However, one problem that has been encountered with both pure chemical etching and RIE etching has been a non-uniform etch rate. Etch rate is generally the measure of how fast material is removed in the etch process. It is generally calculated by measuring the thickness before and after the etch process and dividing the thickness difference by the etch time:

$$\text{ETCH RATE} = \frac{\text{THICKNESS BEFORE ETCH} - \text{THICKNESS AFTER ETCH}}{\text{ETCH TIME}} \quad \text{FIG. 1}$$

Uniformity is generally measured with substrate thickness mapping by measuring the thickness at certain points before and after the etch process, and calculating the etch rates at these points. The mean value (or average value) of the measurement is:

$$\bar{x} = \frac{X_1 + X_2 + X_3 + \ldots + X_N}{N} \quad \text{FIG. 2}$$

Where x is the etch rate at a specific point, on the substrate, and N is the total number of points.

The max-minus-min nonuniformity is defined as:

$$NU_M = \frac{(X_{\max} - X_{\min})}{2\bar{x}} \quad \text{FIG. 3}$$

For example, one area of the substrate may be etched at a faster rate than another area. In general, a non-uniform etch may cause undercutting in the side walls of a trench. Typically, undercutting reduces the thickness of the conducting line or in some cases causes line breakage, which may lead to device failure. Still further, non-uniformity etching generally adds time to the etching process, which reduces processing throughput.

This problem is further aggravated for different types of sequential etch process chemistries. For example, often in a chemical or RIE etch process, the etch rate is typically higher at the edge of the substrate where the local etch rate may be dominated by either chemical reactions at the surface, or by limited etchant transport to the substrate surface.

Referring now to FIGS. 2A–C, a set of simplified figures are shown of a plasma comprising ions and neutrals over a substrate. It is often advantageous in the processing of substrates to etch as many substrate layers as possible during a single processing session (i.e., in-situ). For example, in-situ processing tends to minimize the handling of each substrate, and hence to improve yield, to improve the overall production throughput, and to help minimize the amount of plasma processing chambers required. It would therefore be beneficial to configure plasma processing chamber such that the density of the neutrals and that of the ion are substantially uniform among the various types of plasma chemistries, since a substantially uniform plasma density generally produces a substantially uniform etch. FIG. 2A shows a simplified diagram of a plasma processing chamber, in which the neutral density 110a and the ion density 110b are substantially uniform across the surface of substrate 114.

In addition, the portion of the plasma that extends beyond the edge of the substrate may create a larger volume of neutrals available to etch the edge of the substrate as opposed to the center. FIG. 2B shows a simplified diagram of a plasma processing chamber, in which the neutral density 110a is not substantially uniform, subsequently producing a non-uniform etch profile across the surface of substrate 114.

Another solution may be to narrow the diameter of the plasma chamber in order to substantially equalize the amount of neutrals over the substrate. However, for processes that substantially use ions, narrowing the chamber would also cause more ions to be consumed by collisions with the chamber walls. This would tend decrease the ion concentrations, and hence the etch rate, at the edge of the substrate. FIG. 2C shows a simplified diagram of a plasma processing chamber, in which ion density 110b is not substantially uniform, subsequently producing a non-uniform etch profile across the surface of substrate 114.

In view of the foregoing, there are desired methods and apparatus for tuning a set of plasma processing steps.

SUMMARY OF THE INVENTION

The invention relates, in one embodiment, in a plasma processing system, to a method of tuning of a set of plasma processing steps. The method includes striking a first plasma comprising neutrals and ions in a plasma reactor of the plasma processing system. The method also includes etching in a first etching step a set of layers on a substrate; positioning a movable uniformity ring around the substrate, wherein a bottom surface of the uniformity ring is about the same height as a top surface of the substrate; and striking a second plasma consisting essentially of neutrals in the plasma reactor of the plasma processing system. The method further includes etching in a second etching step the set of layers on the substrate; and wherein the etching in the first step and the etching in the second step are substantially uniform.

The invention relates, in another embodiment, in a plasma processing system including a plasma reactor, to a method of tuning of a set of plasma processing steps. The method includes positioning the movable uniformity ring around the substrate, wherein a top surface of the uniformity ring is at a first height above a bottom surface of the plasma reactor. The method also includes striking a first plasma comprising neutrals and ions in the plasma reactor; etching in a first etching step a set of layers on a substrate, wherein a first amount of etch uniformity on the substrate is achieved; and repositioning the movable uniformity ring around the substrate, wherein the top surface of the uniformity ring is at a second height above the bottom surface of the plasma reactor. The method further includes striking a second plasma consisting essentially of neutrals; and etching in a second etching step the set of layers on the substrate, wherein a second amount of etch uniformity on the substrate is achieved. Wherein the first amount of etch uniformity and the second amount of etch uniformity are substantially uniform.

The invention relates, in another embodiment, in a plasma processing, to an apparatus for tuning of a set of plasma processing steps. The apparatus includes means of striking a first plasma comprising neutrals and ions in a plasma reactor of the plasma processing system. The method also includes a means of etching in a first etching step a set of layers on a substrate; a means of positioning a movable uniformity ring around the substrate, wherein a bottom surface of the uniformity ring is about the same height as a top surface of the substrate; and a means of striking a second plasma consisting essentially of neutrals in the plasma reactor. The method further includes a means of etching in a second etching step the set of layers on the substrate. Wherein the etching in the first step and the etching in the second step are substantially uniform.

The invention relates, in another embodiment, in a plasma processing system including a plasma reactor, to an apparatus for tuning of a set of plasma processing steps. The apparatus includes a means of positioning a movable uniformity ring around the substrate, wherein a top surface of the uniformity ring is at a first height above a bottom surface of the plasma reactor. The apparatus also includes a means of striking a first plasma comprising neutrals and ions in the plasma reactor; means of etching in a first etching step a set of layers on a substrate, wherein a first amount of etch uniformity on the substrate is achieved; and a means of repositioning the movable uniformity ring around the substrate, wherein the top surface of the uniformity ring is at a second height above the bottom surface of the plasma reactor. The apparatus further includes a means of striking a second plasma consisting essentially of neutrals; a means of etching in a second etching step the set of layers on the substrate, wherein a second amount of etch uniformity on the substrate is achieved. Wherein the first amount of etch uniformity and the second amount of etch uniformity are substantially uniform.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
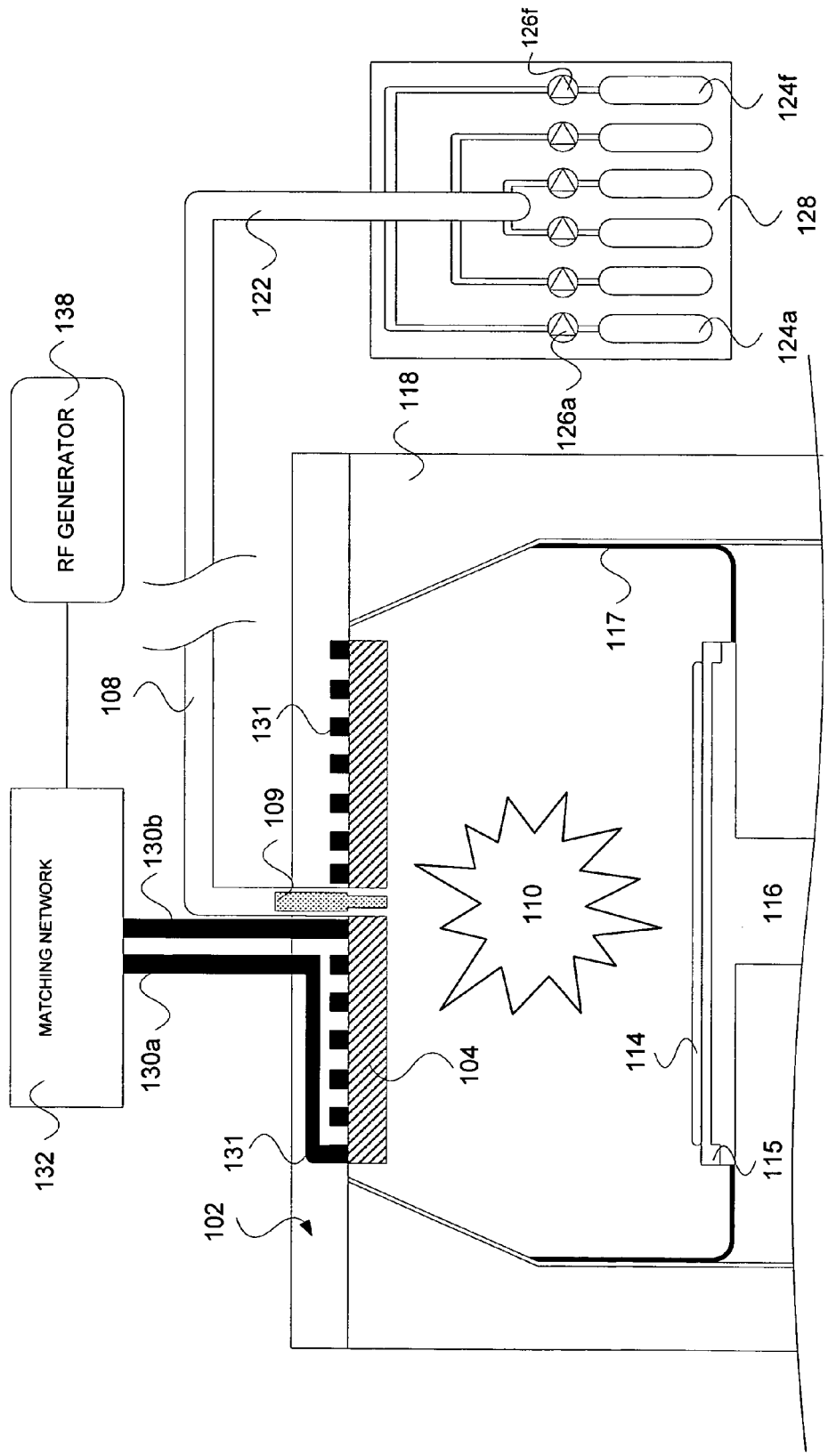
FIG. 1 illustrates a simplified diagram of plasma processing system components.
Figure 2A:
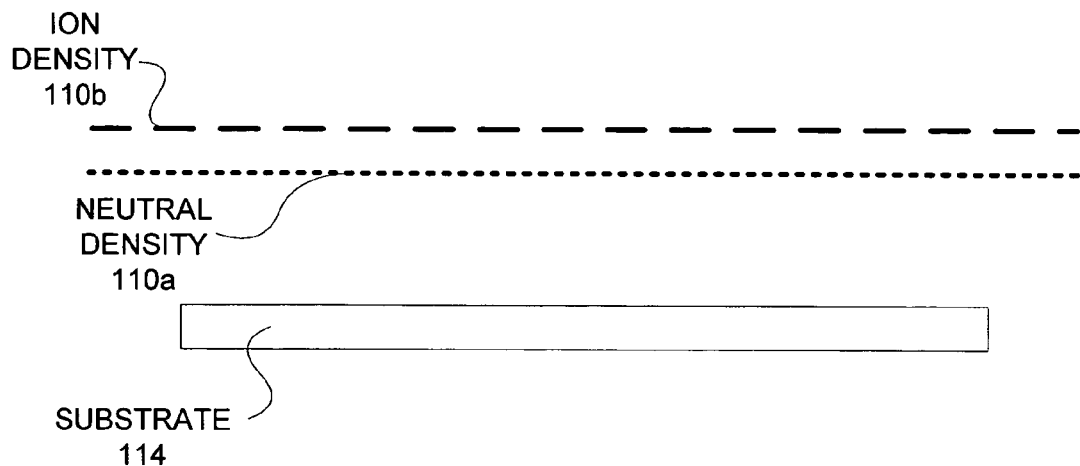
FIGS. 2A–C illustrate a set of simplified figures are shown of a plasma comprising ions and neutrals over a substrate.
Figure 2B:
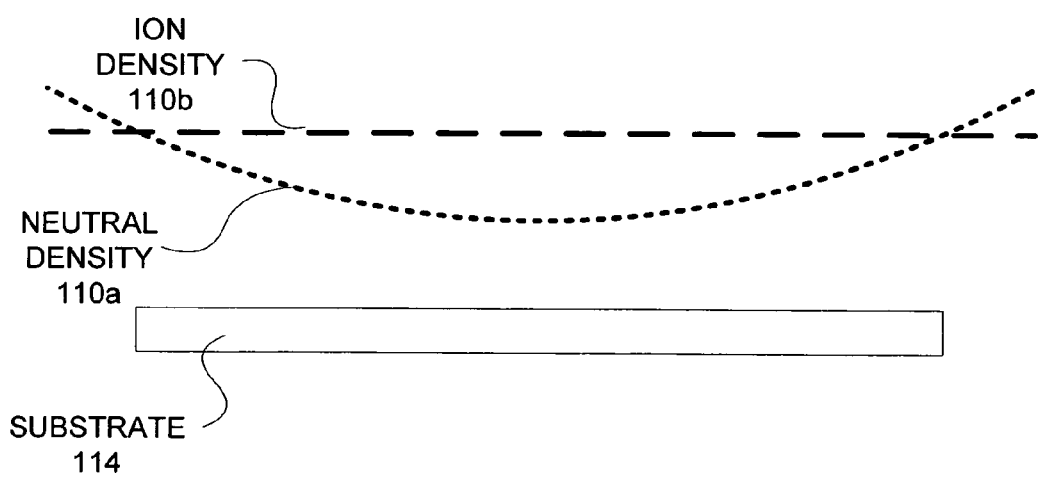
Figure 2C:
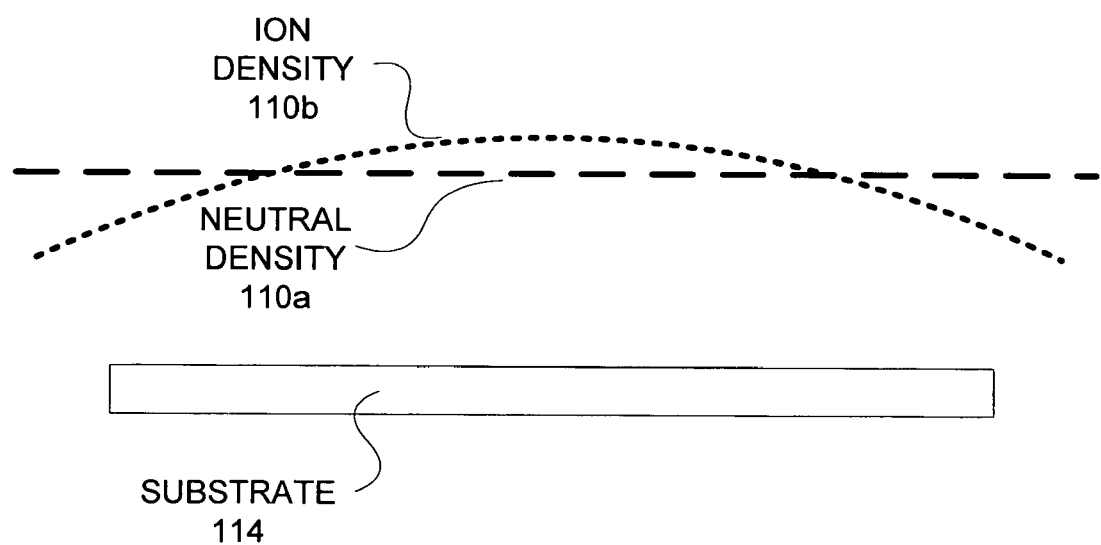

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that a movable uniformity ring can be used in plasma processing applications in order optimize substrate etch uniformity.

In a non-obvious way, a movable uniformity ring can create a substantial physical boundary between the edge of the substrate and the portion of the plasma chamber that extends beyond the substrate, in order to minimize the back diffusion of the plasma over the edge of the substrate. That is, the movable uniformity ring can be positioned to surround the substrate with a wall that blocks a portion of the neutrals (chemical) reactants, in particular the neutral reactants located in the high density neutral reactants area, from diffusing into the substrate.

In addition, by allowing the uniformity ring to be adjusted in-situ, the uniformity of each process step can be optimized without first removing the substrate and adjusting the uniformity ring. That is, if the complete etch application includes a set of processing steps where a uniformity ring is both needed (i.e., etch rate is limited by chemical reaction rates at surface), and process steps where a uniformity ring is not needed, then the use of a fixed uniformity ring, or of no uniformity ring, will lead to a suboptimal overall uniformity.

Generally, movable uniformity rings have generally not been used in plasma processing because of potential contamination cause by placing a moving structure above the substrate during processing. That is, such structure present surfaces for depositing etch by-products (e.g., polymers). When the uniformity ring is moved, the deposits may flake off onto the substrate, causing particle contamination. However, in a non-obvious way, the current invention is designed using material resistant to plasma attack to reduce contamination. Such materials may include yttrium oxide ($Y_2O_3$), zirconium oxide ($ZrO_2$), silicon carbide (SiC), aluminum oxide ($Al_2O_3$), cerium oxide ($CeO_2$), and quartz.

Alternate materials that generate only volatile etch products when exposed to plasma chemistries such as Teflon, Vespel and other pure plastics may also be used to fabricate the movable uniformity rings. In addition, cleaning of the chamber after each processed wafer using a waterless auto clean process, the buildup of deposits that can flake off is minimized.

It should be noted that the term "etched features" herein encompasses features such as trenches, contacts, vias, etc. The etching takes place while the substrate is disposed on a chuck within the plasma processing chamber.

In one embodiment, the uniformity ring may be moved in-situ either substantially equal to the substrate (such that the bottom of the uniformity right is about the same height as the substrate) and below the substrate (such that the top of the uniformity ring is equal to or below the top of the substrate).

In another embodiment, the uniformity ring may be moved in-situ to a range of positions from equal to the substrate to below the substrate.

In another embodiment, the uniformity right may be moved in-situ to a range of positions from above the substrate (such that there is a gap between the bottom of the uniformity ring and the top of the substrate) and the bottom of the substrate.

In another embodiment, the movable uniformity ring is preferably formed from a material that is substantially resistant to etching by the plasma present within the chamber (e.g., inert to the reactive species). The movable uniformity ring should be formed of a material that is able to withstand the plasma environment without unduly contaminating the substrate.

In another embodiment, ceramic materials are employed. In another embodiment, materials such as yttrium oxide ($Y_2O_3$), zirconium oxide ($ZrO_2$), silicon carbide (SiC), aluminum oxide ($Al_2O_3$), cerium oxide ($CeO_2$), or quartz may be used. In another embodiment, materials comprising yttrium, zirconium, aluminum, or cerium may be used. Furthermore, the uniformity ring may be formed of an alternate material with a coating of the above mentioned materials.

In another embodiment, the movable uniformity ring may be formed from materials with volatile etch products such as Teflon, Vespel etc.

In another embodiment, the movable uniformity ring is heated to provide a uniform temperature throughout the etching process and to reduce the amount of polymer build up on the surfaces of the uniformity ring. Generally, plasma process deposition is related to surface temperature. That is, the cooler the temperature, the greater the deposition that must be cleaned. Therefore, the movable uniformity ring is preferably configured to be hot enough to prevent polymer deposition on the side walls of the uniformity ring.

For example, the movable uniformity ring may be heated by conduction or radiation. This may be implemented by heating coils (e.g., electrically), heating lamps, fluid passages, and the like, inside or outside the uniformity ring. In another embodiment, the temperature of the movable uniformity ring may be automatically controlled. For example, when the plasma is charged, the heat inside the chamber generally rises, and therefore the controller is designed to reduce heater power in order to maintain the proper temperature. Correspondingly, heat is generated by the heater when there is no plasma.

Figure 3A:
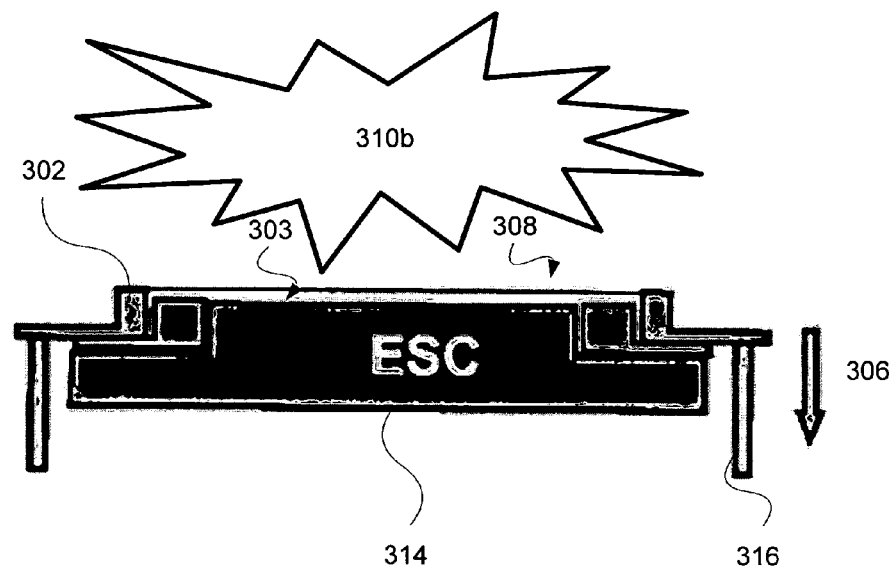
FIGS. 3A–B illustrate a simplified set of diagrams of a movable uniformity ring, according to one embodiment of the invention.
Figure 3A:
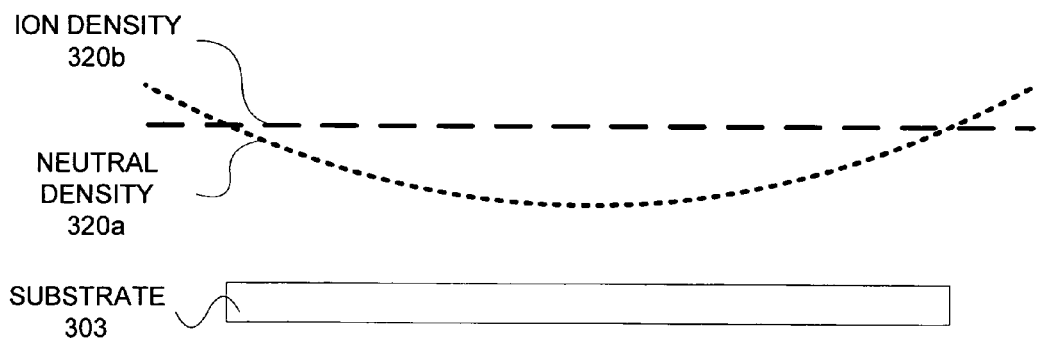
Figure 3B:
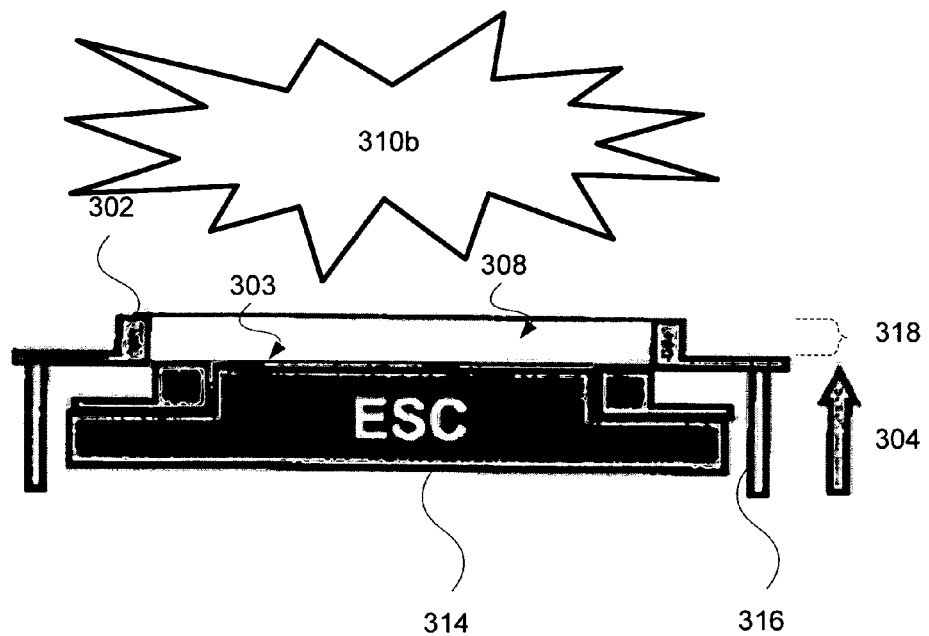
Figure 3B:
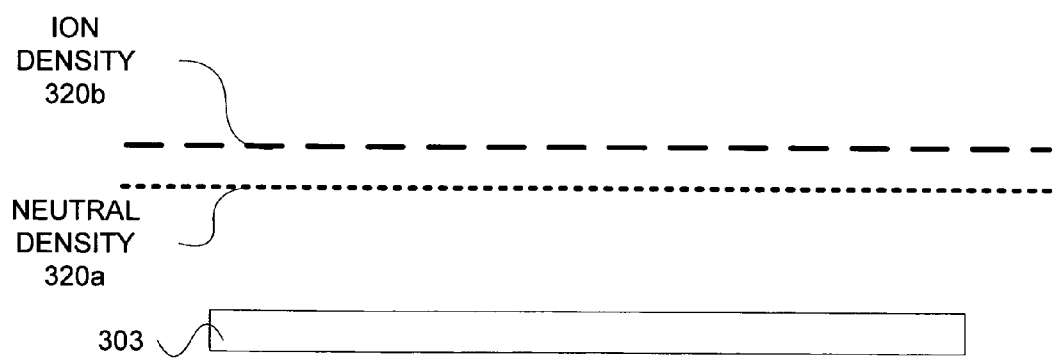

FIGS. 3A–B show a simplified set of diagrams of the movable uniformity ring, according to one embodiment of the invention. Referring now to FIG. 3A, movable uniformity ring 302 is positioned below substrate 303. That is, movable uniformity ring 302 has not been elevated from electrostatic chuck 314. The uniformity ring also includes an opening 308 that is configured for directing species of the plasma towards chuck 314. Furthermore, the uniformity ring may be configured with a substantial wall thickness and/or taper that helps control the amount of species distributed to a substrate during processing.

As previously stated, ions density 320b and the neutral density 320a in plasma 310a determine the etch uniformity for materials disposed on the surface of substrate. In general, when the density of the neutral reactants is high at the edge of the substrate, a non-uniform etch between the center and edge of the substrate is produced.

Referring now to FIG. 3B, movable uniformity ring 302 is positioned substantially equal to substrate 303. That is, movable uniformity ring 302 has been elevated 304 from chuck 314 by an amount 318. Unlike as shown in FIG. 3A, by introducing a uniformity ring above the chuck and surrounding the periphery of the substrate, neutral reactants around the edge of the substrate are substantially blocked from reacting with the edge of the substrate. The decrease in neutral reactant flux around the edge of the substrate tends to produce more a more uniform overall neutral density 320a, and hence etch rate.

By selectively adjusting the height of the movable uniformity ring in-situ, the density of the neutrals and of the ions can be substantially optimized among the various types of plasma chemistries that may be used during a single processing session. This adjustment may subsequently help improve yield, and the overall production throughput.

Figure 4:
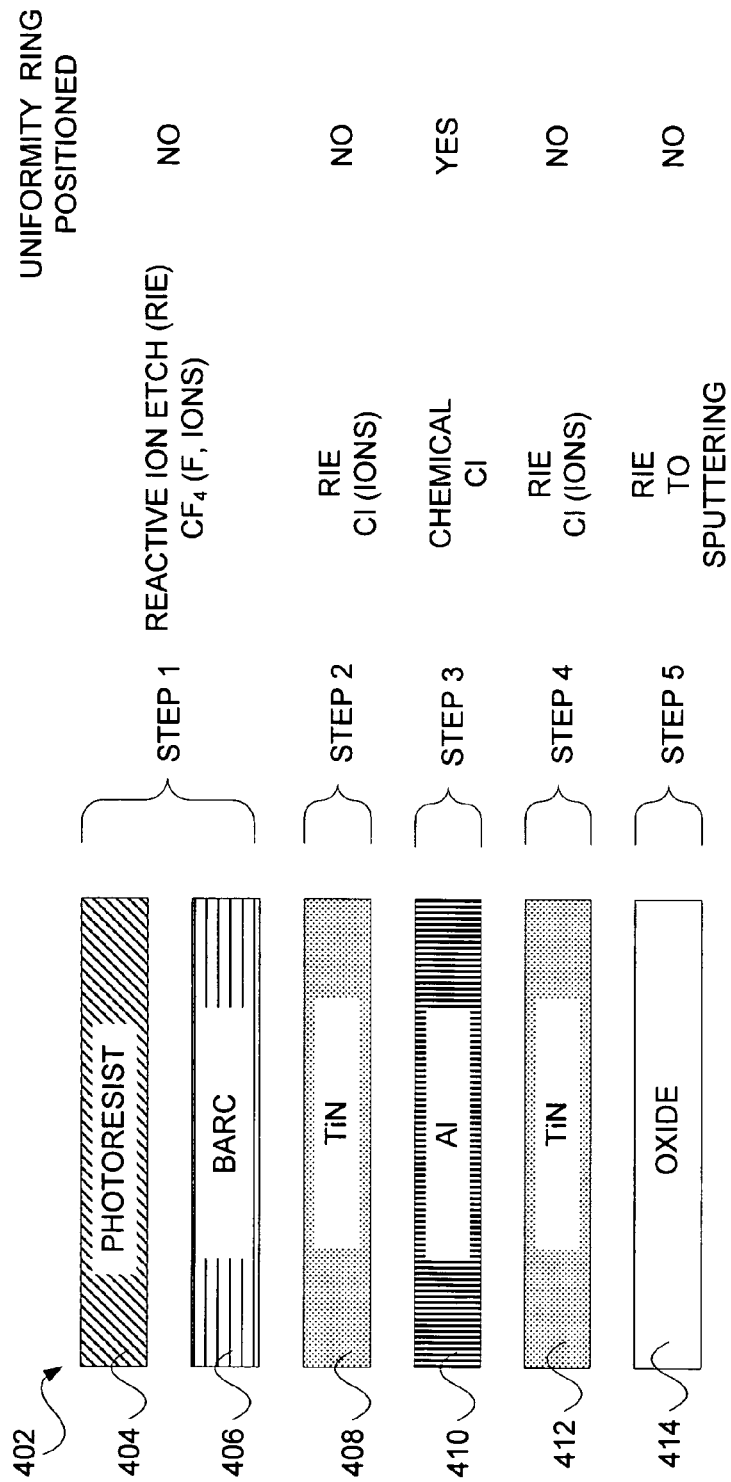
FIG. 4 illustrates a simplified set of layer stacks of an exemplary substrate that is being etched in-situ in a TCP 2300 plasma reactor, according to one embodiment of the invention.

The improvement to substrate uniformity can be substantial. For example, referring now to FIG. 4, a simplified set of layer stacks of an exemplary substrate, is being etched in-situ in a TCP 2300 plasma reactor, which is available from Lam Research Corporation of Fremont, Calif., according to one embodiment of the invention.

At the bottom of the layer stack, there is shown silicon oxide 414. Above layer 414 is disposed a layer 412, comprising TiN. Above layer 412 is disposed a layer 410, comprising aluminum. Above layer 410 is disposed a layer 408, again comprising TiN. Above layer 406 there is disposed BARC. And finally, above layer 406 there is disposed photoresist.

In general, each process step comprises a set of plasma process conditions and a plasma recipe optimized for the set of materials being etched. In step 1, photoresist 404 and BARC 406 are etched using RIE with a fluorine-based etch process (e.g. 10 mT pressure, 1000 Watts inductive power, 200 W bias power, 100 sccms of $CF_4$ flow, at substrate temperature of 40 degrees Celsius). Since the ions are generally assisting the chemical process, the movable uniformity ring needs to be positioned substantially equal to the substrate.

In step 2, TiN 408 is etched using a chlorine-based etch process using RIE (e.g. 10 mT pressure, 1000 Watts inductive power, 200 W bias power, 100 SCCMs Cl2, 100 SCCMs $BCl_3$, possible additives $CH_4$, $N_2$, and or $CHF_3$ in flow rates of less than 30 SCCMs, and with substrate temperature of 40 degrees Celsius.). As in step 1, since the ions are generally assisting the chemical process, the movable uniformity ring needs to be positioned substantially equal to the substrate.

In step 3, Al 410 is etched using a chlorine-based etch process using a chemical process (e.g. 10 mT pressure, 600 W inductive power, 200 W bias power, 100 SCCMs $Cl_2$, 100 SCCMs $BCl_3$, additives $N_2$, $CH_4$, and or $CHF_3$ in flow rates of less than 30 SCCMs, and with substrate temperature of 40 degrees Celsius). However, unlike the previous steps, the movable uniformity ring has been positioned such that the bottom of the uniformity right is about the same height as the substrate. As previously described, the movable uniformity ring substantially block neutrals from reacting with the edge of the substrate producing a more uniform etch. With the movable uniformity ring in place, a max-minus-min nonuniformity of about 8% to about 15% can be achieved. Whereas without the presence of the movable uniformity ring, the max-minus-min nonuniformity is about 2% to about 5%.

In step 4 like step 2, TiN 408 is etched using a chlorine-based etchant using RIE.

And finally in step 5, silicon oxide 414 is etched using a RIE or a chemical process (e.g. 10 mT pressure, 800 W inductive power, 200 W bias power, 100 SCCM $Cl_2$, 100 SCCMs $BCl_3$, and with substrate temperature of 40 degrees Celsius.), without the need of a movable uniformity ring.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, liquid crystal display, etc.). It should also be noted that there are many alternative ways of implementing the methods of the present invention.

Advantages include methods and apparatus for optimizing tunability in a plasma processing system. Additional advantages include substantially improving etch uniformity across a set of etch processes in a plasma chamber, minimizing manufacturing yield problems, and optimizing plasma processing throughput.

Having disclosed exemplary embodiments and the best mode, modifications and variations may be made to the disclosed embodiments while remaining within the subject and spirit of the invention as defined by the following claims.

What is claimed is:

1. In a plasma processing system, a method of tuning of a set of plasma processing steps, comprising:
    striking a first plasma comprising neutrals and ions in a plasma reactor of said plasma processing system;
    etching in a first etching step a set of layers on a substrate;
    positioning a movable uniformity ring around said substrate, wherein a bottom surface of said uniformity ring is about the same height as a top surface of said substrate;
    striking a second plasma consisting essentially of neutrals in said plasma reactor of said plasma processing system;
    etching in a second etching step said set of layers on said substrate;
    wherein said etching in said first step and said etching in said second step are substantially uniform.

2. The method of claim 1, wherein a step of cleaning said plasma reactor is conducted prior to the step of striking said first plasma.

3. The method of claim 2, wherein said step of cleaning said plasma reactor comprises a waterless auto clean process.

4. The method of claim 1, wherein said movable uniformity ring comprises a material resistant to plasma attack.

5. The method of claim 4, wherein said material includes one of quartz, $Y_2O_3$, yttrium, $CeO_2$, cerium, $AlO_3$, aluminum, $ZrO_2$, and zirconium.

6. The method of claim 1, wherein said movable uniformity ring comprises a material that generates a set volatile etch products when exposed to said first plasma and said second plasma.

7. The method of claim 4, wherein said material includes one of Teflon, Vespel, plastic, and ceramic.

8. The method of claim 1, where said movable uniformity ring is heated.

9. In a plasma processing system, including a plasma reactor, a method of tuning of a set of plasma processing steps, comprising:
    positioning said movable uniformity ring around said substrate, wherein a top surface of said uniformity ring is at a first height above a bottom surface of said plasma reactor;
    striking a first plasma comprising neutrals and ions in said plasma reactor;
    etching in a first etching step a set of layers on a substrate, wherein a first amount of etch uniformity on said substrate is achieved;
    repositioning said movable uniformity ring around said substrate, wherein said top surface of said uniformity ring is at a second height above said bottom surface of said plasma reactor;
    striking a second plasma consisting essentially of neutrals;
    etching in a second etching step said set of layers on said substrate, wherein a second amount of etch uniformity on said substrate is achieved;
    wherein said first amount of etch uniformity and said second amount of etch uniformity are substantially uniform.

* * * * *